(12) United States Patent
Park et al.

(10) Patent No.: US 11,771,159 B2
(45) Date of Patent: Oct. 3, 2023

(54) MODULARIZED GARMENT MANUFACTURING METHOD FOR SMALL QUANTITY BATCH PRODUCTION OF GARMENTS AND MODULARIZED GARMENT MANUFACTURING SYSTEM

(71) Applicants: Hojeon Limited, Seoul (KR); Seoul National University R&DB Foundation, Seoul (KR)

(72) Inventors: Young Chul Park, Seoul (KR); Sung Hoon Ahn, Seongnam-si (KR); Eun Suk Suh, Seoul (KR); Sung Min Kim, Seoul (KR); Seong Cheol Kim, Seoul (KR); Woo Kyun Jung, Chuncheon-si (KR)

(73) Assignees: Hojeon Limited, Seoul (KR); Seoul National University R&DB Foundation, Seoul (KR)

( * ) Notice: Subject to any disclaimer, the term of this patent is extended or adjusted under 35 U.S.C. 154(b) by 708 days.

(21) Appl. No.: 16/968,629

(22) PCT Filed: Feb. 13, 2019

(86) PCT No.: PCT/KR2019/001723
§ 371 (c)(1),
(2) Date: Aug. 10, 2020

(87) PCT Pub. No.: WO2019/160309
PCT Pub. Date: Aug. 22, 2019

(65) Prior Publication Data
US 2020/0397081 A1    Dec. 24, 2020

(30) Foreign Application Priority Data

Feb. 14, 2018 (KR) .......................... 10-2018-0018727
Feb. 8, 2019 (KR) .......................... 10-2019-0015141

(51) Int. Cl.
*A41H 3/00*    (2006.01)
*G06Q 50/04*    (2012.01)
(Continued)

(52) U.S. Cl.
CPC ............. *A41H 3/007* (2013.01); *G06F 18/00* (2023.01); *G06F 18/214* (2023.01); *G06F 30/17* (2020.01);
(Continued)

(58) Field of Classification Search
CPC ........ A41H 3/007; A41H 42/00; G06F 18/00; G06F 18/214; G06F 30/17;
(Continued)

(56) References Cited

U.S. PATENT DOCUMENTS 10,366,175 B2 *   7/2019   Gupta ................. G06Q 30/0621
10,664,629 B2 *   5/2020   Gupta ................... A41H 3/007
(Continued)

FOREIGN PATENT DOCUMENTS

CN    103314335 A    9/2013
CN    105512434 A    4/2016
(Continued)

OTHER PUBLICATIONS

International Search Report (with English Translation) dated May 24, 2019 for International Application No. PCT/KR2019/001723; 4 Pages.

*Primary Examiner* — Yaritza Guadalupe-McCall
(74) *Attorney, Agent, or Firm* — DALY CROWLEY MOFFORD & DURKEE, LLP

(57) ABSTRACT

Disclosed are modularized garment manufacturing method and system for small quantity batch production of garments. Basic components constituting an ordered garment are generated by analyzing shape graphic data of the ordered garment. For each basic component, basic patterns are
(Continued)

generated for each dimension of the ordered garment. The basic patterns are compared with reference garment patterns stored in a garment pattern database to determine a pattern category of each basic pattern. Based on the pattern category of the basic patterns and information on garment production lines currently in operation, subdivided work modules are determined for each basic pattern. A configuration of modular sewing process lines, which include module processing lines for manufacturing the working modules and component-joining process lines for completing production of the ordered garment by joining the basic pattern products produced in each module processing line, is designed based on operation information of a garment production line.

27 Claims, 8 Drawing Sheets

(51) Int. Cl.
*G06Q 10/0631* (2023.01)
*G06F 30/17* (2020.01)
*G06F 18/00* (2023.01)
*G06F 18/214* (2023.01)

(52) U.S. Cl.
CPC ....... *G06Q 10/06316* (2013.01); *G06Q 50/04* (2013.01)

(58) Field of Classification Search
CPC ............. G06Q 10/06316; G06Q 50/04; G06Q 10/043; B26D 7/015; B26D 2005/002; D05D 2205/085; D05B 25/00; Y02P 90/30

See application file for complete search history.

(56) References Cited

U.S. PATENT DOCUMENTS

| | | | | |
|---|---|---|---|---|
| 11,052,677 | B2* | 7/2021 | Dziesietnik | G06F 3/1219 |
| 11,055,758 | B2* | 7/2021 | Su | G06Q 30/0643 |
| 11,112,772 | B2* | 9/2021 | Choche | G06F 16/16 |
| 11,421,364 | B2* | 8/2022 | Schiestl | A41H 3/007 |
| 11,461,819 | B2* | 10/2022 | Choche | G06Q 30/0621 |
| 11,503,870 | B2* | 11/2022 | Aggarwal | A41H 3/007 |
| 11,519,109 | B2* | 12/2022 | Resneck | D04B 1/24 |
| 11,559,098 | B2* | 1/2023 | Choche | A41H 3/007 |
| 2008/0249652 | A1* | 10/2008 | Burr | G06Q 30/06 700/131 |
| 2009/0222127 | A1* | 9/2009 | Lind | G06Q 30/0601 705/26.1 |
| 2018/0253508 | A1* | 9/2018 | Gupta | G06Q 50/04 |
| 2020/0397081 | A1* | 12/2020 | Park | G06F 18/00 |
| 2021/0017681 | A1* | 1/2021 | Resneck | D04B 15/70 |
| 2021/0065287 | A1* | 3/2021 | Sights | H04N 9/3185 |
| 2022/0119996 | A1* | 4/2022 | deGuzman | D04B 37/02 |
| 2022/0361612 | A1* | 11/2022 | Park | G06Q 50/04 |
| 2023/0036395 | A1* | 2/2023 | Kuehn | A41H 3/007 |

FOREIGN PATENT DOCUMENTS

| | | |
|---|---|---|
| JP | 2005-179792 A | 7/2005 |
| KR | 2013-0007405 A | 1/2013 |
| KR | 10-1283757 B1 | 7/2013 |
| KR | 10-1727576 B1 | 4/2017 |
| KR | 10-1825881 B1 | 2/2018 |

* cited by examiner

FIG. 5
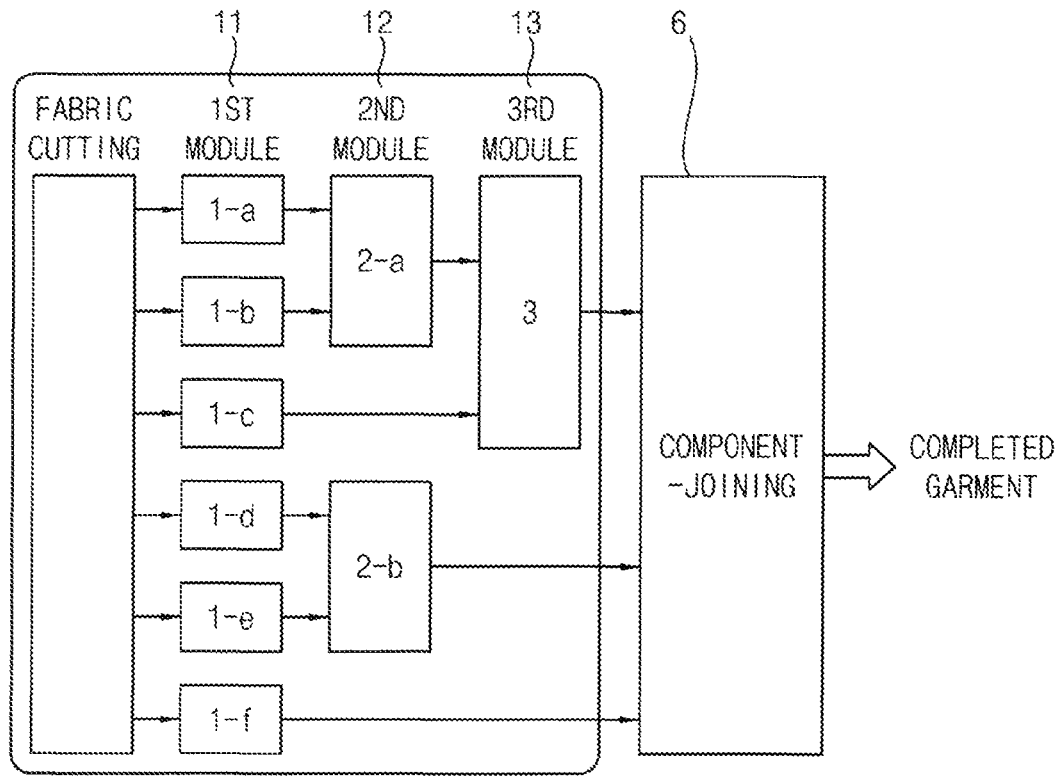
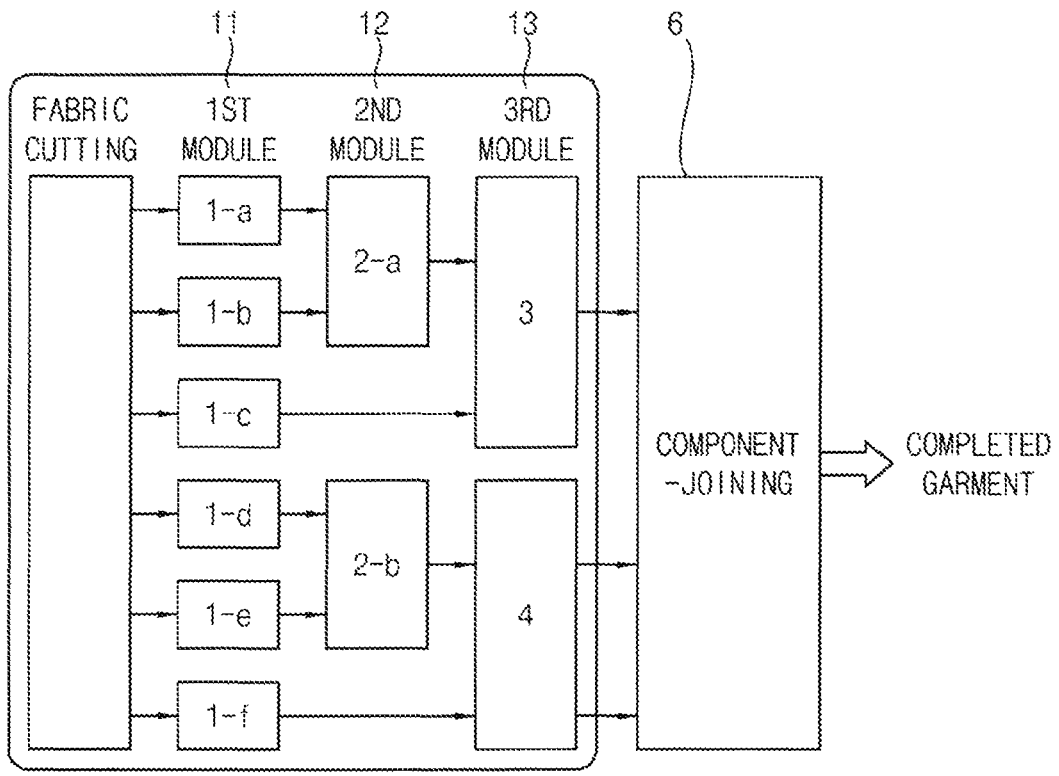

MODULARIZED GARMENT MANUFACTURING METHOD FOR SMALL QUANTITY BATCH PRODUCTION OF GARMENTS AND MODULARIZED GARMENT MANUFACTURING SYSTEM

CROSS REFERENCE TO RELATED APPLICATIONS

This application is a U.S. National Stage Application of International Application No. PCT/KR2019/001723 filed on Feb. 13, 2019 which is based upon and claims the benefit of priority to Korean Patent Application No. 10-2018-0018727 filed on Feb. 14, 2018 and Korean Patent Application No. 10-2019-0015141 filed on Feb. 8, 2019 in the Korean Intellectual Property Office. The disclosures of the above-listed applications are hereby incorporated by reference herein in their entirety.

BACKGROUND

1. Technical Field

The present inventive concept relates to a modular garment manufacturing method and a modular garment manufacturing system for the small quantity batch production of garments, and more particularly to the modular garment manufacturing method and system that can overcome the problems of the conventional mass production methods through modularization of a garment production process in small quantity batch production of garments.

2. Description of the Related Art

Compared to the single or small item mass production of garments, the small quantity batch production of garments has several distinct characteristics. Unlike the conventional mass production method that requires fabric cutting by hundreds to thousands of sheets every time, the small quantity batch production of various garments styles requires fabric cutting by several to tens of sheets. In order to mass-produce thousands to tens of thousands of garments, it is necessary to maintain the same production line for tens of days to tens of months. However, for the small quantity batch production of garments, the production line may be maintained for a short period of one to several days for each garment. Accordingly, a rapid and flexible change of the production lines is necessary. The existing mass production methods can utilize the period to improve the quality of the production line by increasing the production level. However, the small quantity batch production method cannot be operated for a period of time for quality improvement, so specialized workers with a high working level are required at all times.

Conventionally, the sewing process line for mass production of small items is mostly designed to be a type of straight line. Dozens of fabrics are stacked and cut separately. The subsidiary materials and fabric cuts are moved to the straight production line, and sewing works are performed in a manner that the fabric cuts are moved and joined together along the production line. The reason why the sewing process lines are designed in the type of straight line is that the sewing workers need to repeat continuously the same work for a certain long period of time (for example, longer than one month for an outdoor jacket) to increase the production efficiency in the mass production each of the sewing workers.

FIG. 1 shows an example of a sewing process line constructed in the form of straight line for producing a hooded top. Referring to FIG. 1, the sewing process line for to producing a hood by sequentially performing a lining work, a hood lining work, and a hood shelling work is constructed in the form of straight line. In addition, a work line for the back and sleeves of the top, collars, cuffs and tabs, hand pockets and the front, and a work line for joining these with the hood, making the plackets and collars, and further joining them to complete a garment is also constructed in the form of separate straight line.

In general, designing the sewing process line in the form of straight line may include analyzing a sample garment to find out the number of sewing processes for the garment, and then constructing a layout of the sewing process line. The main consideration for how many workers will be placed in the sewing process line is a total working time taken by a standard worker to make a garment, that is, the total standard minute value (SMV). Here, the SMV represents the working time required for a standard worker to perform a specific task under predetermined conditions.

It is possible to determine the most suitable number of workers by dividing the total working time required to make a suit of garment by a unit working time of one person. The SMV per worker usually depends on the style and difficulty of the work. For woven fabrics, 2-3 minutes for example may be considered as the SMV for a worker. For knitted fabrics, the SMV per a worker is usually considered to be less than 1 minute. For example, when the total working time takes 100 minutes, the number of workers to be put in is approximately 40. In the case of garment production where the total working time takes approximately 150 minutes, 50 to 55 workers should be put in. When the total working time is 160 minutes, the working line may be designed in the same way as about 60 workers are input in. The relationship between the working time required and the number of workers is determined by the material of fabric (woven, knitted), the style of garments (top, bottom, etc.) and the difficulty of working in the same species.

To produce a new style of garment after production of one style of garment is completed in the sewing process line of the straight line type, the layout of the sewing production line must be newly changed for the new style of garment. It takes a lot of time for a new production line newly designed to reach a certain level of productivity from setting up the new production line. In other words, layout change of the production line is the biggest factor that decreases the production efficiency. For example, when a layout of the production line is changed to produce an outdoor jacket with woven fabric, the production efficiency of the first day is usually 40% compared to an average production efficiency of 100%. Afterwards, as workers become familiar with the process for the outdoor jacket, the production efficiency usually may increase by 10% per day. Thus, the production efficiency is 50% on day 2, 60% on day 3, 70% on day 4, 80% on day 5, 90% on day 6, and 100% on day 7. Here, the maximum production efficiency is assumed to be 140%. Also, if the production efficiency exceeds 100%, it is not considered to increase by 10% per day. In some cases, it may rise in less than 10% increments. Assuming that the production efficiency increase in this way and the same design or style of garment is produced for about 30 days or more on average, the average production efficiency for 30 days may come to about 100%. Apart from this, production is impossible for about one day depending on the layout installation and change due to the style change, worker process training, etc. That is, the production efficiency during this period may be approximately 0%.

For this reason, frequent changes of the design or style of garment caused due to a small production quantity may result in a very large loss of work efficiency because the production process in the form of straight line should be frequently changed accordingly. For this reason, when garments need to be manufactured in the manner of small quantity batch production, the production method using the production process of straight line is not suitable because it causes a great loss in production efficiency. Therefore, other suitable production process rather than the production process in the form of straight line is needed for the small quantity batch production.

In some cases, it may be necessary to make several different styles of garments at the same time in order to produce a small quantity of multi-variety garments. In such a case, it may be necessary to operate multiple production lines at the same time and to frequently change the production lines. Measures need to be taken to maximize work efficiency while flexibly responding to these demands. Traditionally, however, configuration of the production lines, machines and workers to be put in, the sequence between different tasks, and the movement of raw materials that are optimal to produce each style of garment were determined by the intuition of experienced managers or workers based on their experiences. However, there is no guarantee that the intuition-based determination is best.

SUMMARY

The present inventive concept is intended to overcome the problems of the conventional production method using the straight line type of production line, and to propose a production method based on modular sewing work lines that can reduce loss of work efficiency to the maximum even if the style of garments is changed in a short working period. In other words, the object of the present inventive concept is to provide a garment manufacturing method and system that the garment production processes and lines are subdivided and modularized to provide flexibility in responding to various garment style and designs, so that the problems of traditional mass production method can be overcome and the need of market that is changed to the small quantity batch production method can be met.

The basic concept of this invention is to design the production tasks of each worker to be similar even if the style or design of garment to be made is changed. In other words, similar works are grouped (modularized) so that even if the style or design of the garment to be manufactured is changed, there is no need of significant change in the work process of each production module. This is to ensure that there is no drastic reduction in production efficiency due to style or design changes.

To this end, a work module may be defined such that the modular work is not significantly affected by the style change. The modular work should be prepared so that there is no time loss in a sewing-for-joining-components process. In addition, scheduling functions such as dividing the entire works into several modular works in advance according to the production plan, and determining the sequence and transfer of the work by process become very important.

In order to solve the above problems, the present inventive concept employs the following means. A modularized garment manufacturing method according to embodiments of the present inventive concept for achieving the above object is a method to produce a garment by using a computer program which is run by a first computer device. The modularized garment manufacturing method includes generating a plurality of basic components constituting an ordered garment by analyzing shape graphic data of the ordered garment; generating basic patterns for each dimension of the ordered garment for each of the plurality of basic components; classifying a pattern category of each of the plurality of basic patterns by comparing the plurality of basic patterns with reference garment patterns stored in a garment pattern database in terms of similarity; determining work modules subdivided for each of the plurality of basic patterns based on classification result of the pattern category of the plurality of basic patterns and information on a garment production line currently in operation; and designing a configuration of modular sewing process lines based on operation information of a garment production line which includes module processing lines for manufacturing the determined working modules and a component-joining process line for completing production of the ordered garment by joining the basic pattern products produced in each of the module processing lines.

In an embodiment of the present inventive concept, the modularized garment manufacturing method may further include generating a job instruction, in the first computer device, for each process line based on the overall configuration of the modular sewing process lines to be output for printing, so that basic pattern product produced in each of the module processing lines is delivered to the component-joining process line in order according to a joining order specified in the job instruction for the component-joining process line.

In an exemplary embodiment, the modularized garment manufacturing method may further include calculating, in the first computer device, information on amounts of fabric cuts and subsidiary materials required for sewing operation for each process line of the modular sewing process lines to be transferred to a second computing device for a warehouse of fabric cuts and subsidiary materials, so that the fabric cuts and subsidiary materials in the warehouse can be supplied as much as needed to each process line.

In an exemplary embodiment, identification of the plurality of basic components for generating the basic patterns may be made by scanning shape graphic data of the ordered garment and classifying scanned shape graphic data for each basic component based on a shape recognition algorithm.

In an exemplary embodiment, the basic patterns for each dimension of the ordered garment may be generated by a parametric patterning method that divides a pattern of each of the basic components constituting the ordered garment into a plurality of points and functioning relationships between the plurality of points, thereby flexibly adjusting dimension of a basic pattern of each of the basic components according to garment sizes.

In an exemplary embodiment, the modularized garment manufacturing method may further include calculating a working time, in the first computer device, required to manufacture each of the generated basic patterns for each dimension in the first computer device; and calculating a total working time, in the first computer device, for each work module, wherein determination of the work modules is made by grouping works for the basic patterns so as to resulting in a smallest deviation between calculated total working times for work modules.

In an exemplary embodiment, the working time may be calculated based on a SMV.

In an exemplary embodiment, the modularized garment manufacturing method may further include calculating an amount of fabrics and an amount of auxiliary materials required to produce the ordered garment according to an order, in the first computer device, using information on size and a volume of order of the ordered garment.

In an exemplary embodiment, the modularized garment manufacturing method may further include learning a reference garment pattern for each component of a garment, in the first computer device, based on a predetermined machine learning algorithm using general garment pattern data as learning data; and classifying learned reference garment patterns by garment and by pattern category, in the first computer device, to be stored in the garment pattern database.

In an exemplary embodiment, determination of the work modules may be made based on one criterion or combined two or more criteria out of (i) sameness or similarity of the basic components for component-joining of the ordered garment, (ii) sameness of sewing machines to be used, and (iii) minimization of deviations between working times of the working modules.

In an exemplary embodiment, configuration of the module processing lines may be designed based on sewing work priority of the determined work modules and component-joining order of the plurality of basic patterns.

In an exemplary embodiment, the sewing work priority may be determined based on an order of delivery deadline.

In an exemplary embodiment, configuration of the module processing lines may be designed such that works for work modules having similar shapes and joining orders and/or work modules that can worked jointly are performed in a same module processing line.

In an exemplary embodiment, the designing may include: grouping the plurality of basic patterns of the ordered garment for each style of garment based on similarity of the basic patterns for component-joining to designate each group of the basic patterns as a first module; grouping sub-processes of the first module based on sameness of sewing devices used to designate each group of the sub-processes as a secondary module; when there are a plurality of sub-processes of the secondary module, subdividing each sub-process of the secondary module into basic processes each of which is composed of one operation; calculating a total working time for each work module in consideration of standard minute value (SMV) of each of the subdivided basic processes; and forming the module processing lines by grouping the basic processes so that the deviation between the calculated total working times for the work modules is the smallest.

In an exemplary embodiment, the module processing lines may be designed such that a deviation between working times taken to complete basic pattern products required for component-joining in the module processing lines is within ±5%.

In an exemplary embodiment, the work module may be configured in stages from a first module divided according to the basic components to an N-th module each of which is composed of basic processes each of which consists of one operation by subdividing sub-processes of the first module, and wherein working times of the first to the N-th modules are respectively determined so that production of each basic pattern product is completed before a turn to sew each of basic pattern products produced for the first module arrives.

In an exemplary embodiment, the module processing lines may be designed such that a deviation between working times taken to complete basic pattern products required for component-joining in the module processing lines is within ±5%.

Meanwhile, a modular garment manufacturing system according to exemplary embodiments of the present inventive concept for achieving the above object is for small quantity batch production of garments. The modular garment manufacturing system includes a first computer device that includes an order/production information input unit, an order information analysis unit, a modular pattern classification unit, and a modular process design unit. The order/production information input unit is configured to generate a plurality of basic components constituting an ordered garment by analyzing shape graphic data of the ordered garment. The order information analysis unit is configured to generate basic patterns for each dimension of the ordered garment for each of the plurality of basic components. The modular pattern classification unit is configured to classify a pattern category of each of the plurality of basic patterns by comparing the plurality of basic patterns with reference garment patterns stored in a garment pattern database in terms of similarity. The modular process design unit is configured to determine work modules subdivided for each of the plurality of basic patterns based on a result of determining the pattern category of the plurality of basic patterns and information on a garment production line currently in operation, and to design a configuration of modular sewing process lines based on operation information of a garment production line which includes module processing lines for manufacturing the determined working modules and a component-joining process line for completing production of the ordered garment by joining the basic pattern products produced in each of the module processing lines.

In an exemplary embodiment, the modular process design unit may be further configured to generate a job instruction for each process line based on the overall configuration of the modular sewing process lines to be output for printing, so that basic pattern product produced in each of the module processing lines is delivered to the component-joining process line in order according to a joining order specified in the job instruction for the component-joining process line.

In an exemplary embodiment, the modular process design unit may be further configured to calculate information on amounts of fabric cuts and subsidiary materials required for sewing operation for each process line of the modular sewing process lines to be transferred to a second computing device for a warehouse of fabric cuts and subsidiary materials, so that the fabric cuts and subsidiary materials in the warehouse can be supplied as much as needed to each process line.

In an exemplary embodiment, the order information analysis unit may identify the plurality of basic components, for generating the basic patterns, by scanning shape graphic data of the ordered garment and classifying scanned shape graphic data for each basic component based on a shape recognition algorithm.

In an exemplary embodiment, the modular process design unit may be further configured to design the module processing lines by calculating a working time required to manufacture each of the generated basic patterns for each dimension, a total working time for each work module, and determining the work modules in a manner of grouping works for the basic patterns so as to resulting in a smallest deviation between calculated total working times for work modules.

In an exemplary embodiment, the order information analysis unit may be further configured to calculate an amount of fabrics and an amount of auxiliary materials required to produce the ordered garment according to an order, using information on size and a volume of order of the ordered garment, and provide calculated results to the modular process design unit.

In an exemplary embodiment, the garment pattern database unit may be constructed by learning a reference garment pattern for each component of a garment based on a predetermined machine learning algorithm using general garment pattern data as learning data, and classifying learned reference garment patterns by garment and by pattern category to be stored in the garment pattern database.

In an exemplary embodiment, the modular process design unit may determine the work modules based on one criterion or combined two or more criteria out of (i) sameness or similarity of the basic components for component-joining of the ordered garment, (ii) sameness of sewing machines to be used, and (iii) minimization of deviations between working times of the working modules.

In an exemplary embodiment, the modular process design unit may design configuration of the module processing lines based on at least one of (i) using sewing work priority of the determined work modules and component-joining order of the plurality of basic patterns as a basis of the design, and (ii) grouping the work modules such that works for work modules having similar shapes and joining orders and/or work modules that can worked jointly are performed in a same module processing line.

In an exemplary embodiment, the modular process design unit designs configuration of the module processing lines such that a deviation between working times taken to complete basic pattern products required for component-joining in the module processing lines is within ±5%.

According to the garment manufacturing method of the present inventive concept, the production lines for the ordered garment can be designed such that the production process of each worker is similar by grouping and modularizing tasks between similar processes. By doing so, even if the style of garment to be produced is changed within a short working period, the work efficiency loss can be reduced to the maximum. The garment manufacturing method of the present inventive concept is suitable for the needs of the market, which is changed in a small quantity batch production method for multiple kinds of garments.

BRIEF DESCRIPTION OF THE DRAWINGS

Illustrative, non-limiting example embodiments will be more clearly understood from the following detailed description taken in conjunction with the accompanying drawings.

FIG. 5 shows an example of process sequence adjustment proposed by artificial intelligence (AI) based on big data according to an example embodiment of the present inventive concept.

DETAILED DESCRIPTION OF THE EMBODIMENTS

Figure 1:
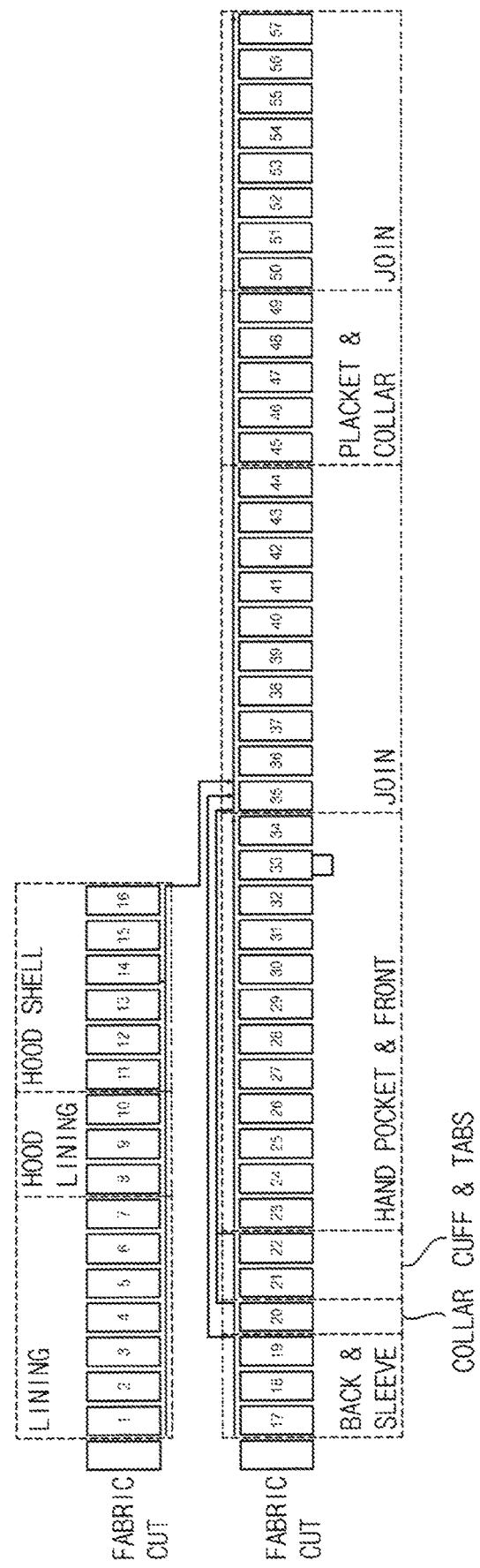
FIG. 1 shows an example configuration of a straight-line type production line used to produce one existing style.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the modular garment manufacturing method and system suitable for the small quantity batch production of garments according to embodiments of the present inventive concept will be described in detail with reference to the accompanying drawings. The present inventive concept may, however, be embodied in many different forms, and thus, specific embodiments will be illustrated and described in detail in the text. However, this is not intended to limit the present inventive concept to specific disclosure forms, and it should be understood that all modifications, equivalents, and substitutes included in the spirit and scope of the present inventive concept are included. In the accompanying drawings, the dimensions of the structures are shown to be enlarged than the actual for clarity of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or parts, but do not preclude the presence or addition of one or more other features, integers, steps, operations, elements, parts, and/or groups thereof.

[Modular Garment Manufacturing Method Suitable for Small Quantity Batch Production of Garments]

Figure 2:
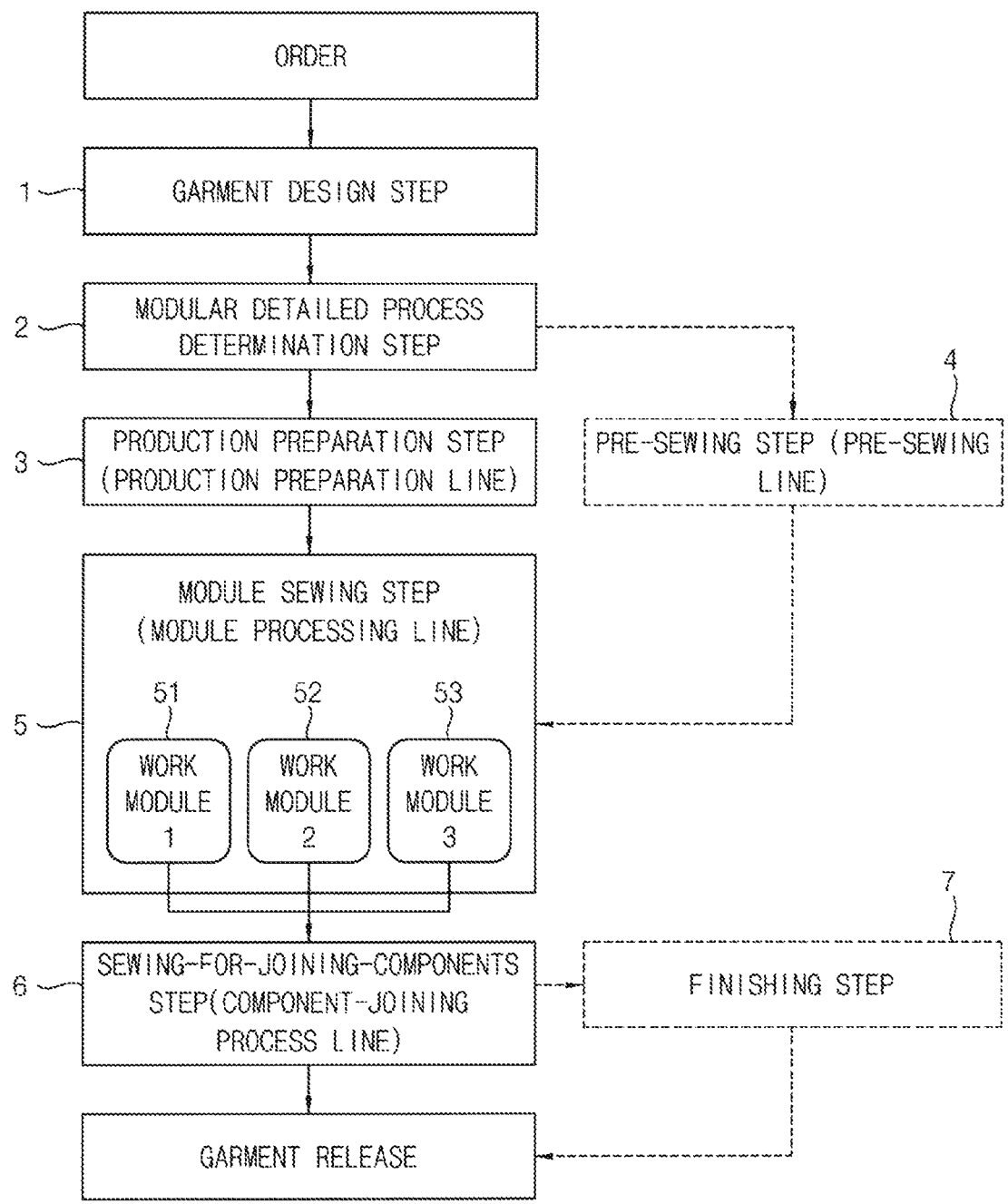
FIG. 2 shows a conceptual diagram of a modular garment manufacturing method for the production of small quantity batch production of garments according to an example embodiment of the present inventive concept.

As illustrated in FIG. 2, the modular garment manufacturing method according to an example embodiment may include a garment design step 1, a modular detailed process determination step 2, a production preparation step 3, a module sewing step 5 and a sewing-for-joining-components step 6.

[Garment Design Step]

First, in the garment design step 1, the design of ordered garment may be carried out to reflect the request of a buyer. Through the design, the completed design information may be input to a server computer. The design information may include graphic data that represent the shape or form of the ordered garment. The information such as dimensions of ordered garment, quantity of order, delivery date, etc. may also be provided to the server computer. In addition, specific information on garment production lines currently in operation at the factory may be provided to the server computer. Information provided to the server computer may include, for example, information about how many production lines are currently in operation for each component of garment. Such a task may be performed by the order/production information input unit 210 to be described in relation to FIG. 7.

Figure 3:
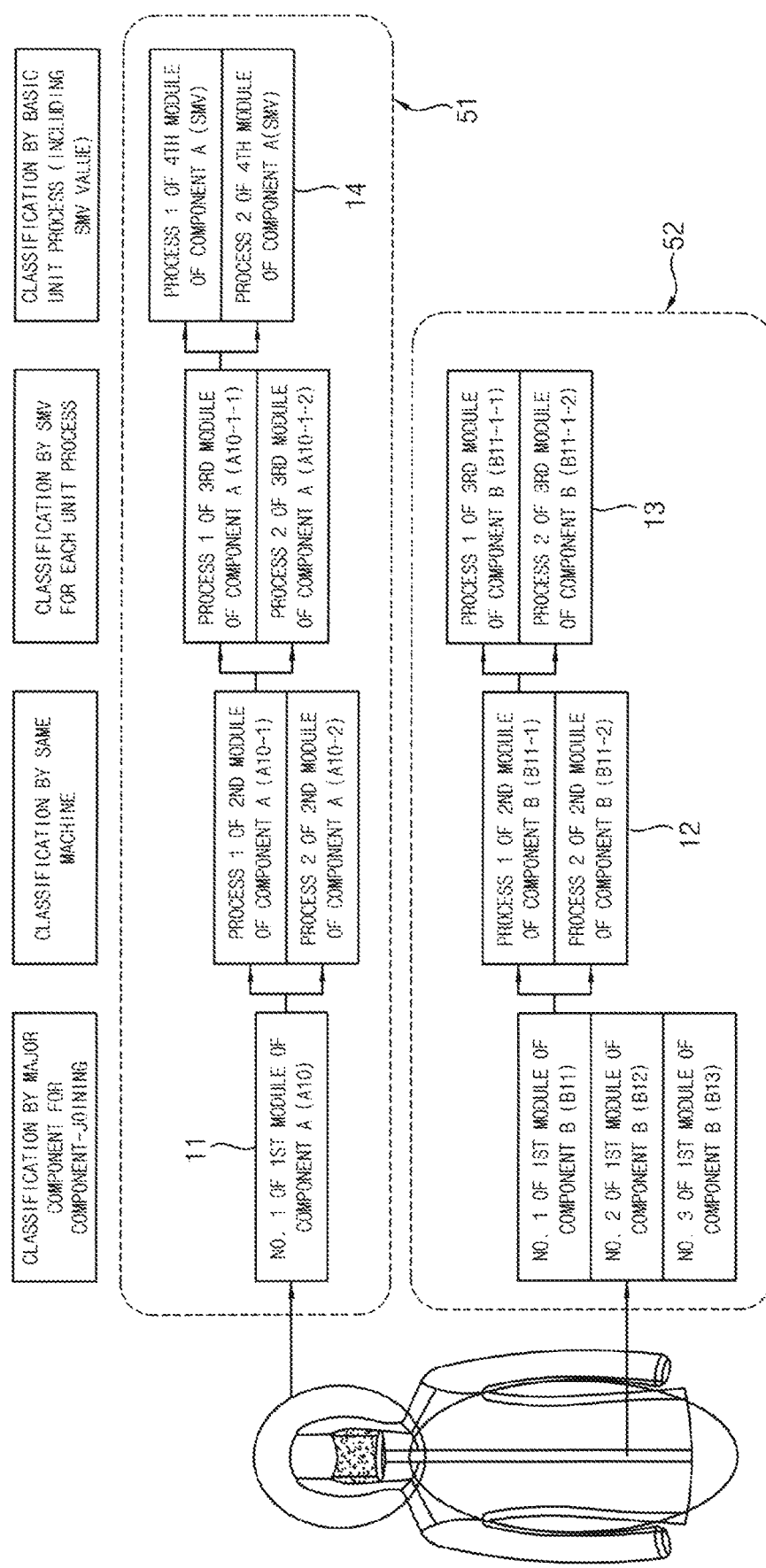
FIG. 3 illustrates a method of determining basic components of a garment and a module unit, taking into account the component-joining process according to an example embodiment of the present inventive concept.

In the server computer, the basic components may be determined by analyzing the entered design information and considering the component-joining process. The basic components refer to the parts necessary for the components-joining according to the type and style of the garment, and may include, for example, sleeve, body components (body front panel, and body back panel), hood, etc., as illustrated in FIG. 3. One garment illustrated in a design figure may consist of a combination of multiple basic components. For example, the basic components of a garment ordered may be identified by scanning graphic data of the design drawing of the garment and classifying the scanned graphic data into basic components using a feature recognition algorithm. Such work may be carried out by the order information analysis unit 220 to be described later in relation to FIG. 7.

In the server computer, the basic patterns may be determined by automatically patterning each of the basic components of the ordered garment. The data accumulated in a garment pattern database 240 may be used to determine the basic patterns for basic components. The database 240 may be constructed by synthesizing the data collected in the course of the existing garment production, the review data of professional designers, and the data collected by monitoring the garment production equipment 21. Conventionally, garment patterns were made by an experienced patternmaker using basic paper patterns intuitively based on human measurements. This conventional pattern-making method was difficult to produce patterns that fit the human bodies of various dimensions, and additionally required grading and fitting processes to modify patterns with different dimensions. However, in the example embodiment of the present inventive concept, it is possible to produce garment that fits the wearer's body well by automatically generating dimension-by-dimensional patterns of the ordered garment based on the garment pattern database 240 accumulated in the server computer 200.

In an example embodiment, dimension-specific patterns of the ordered garment may be automatically generated through a parametric patterning method. The parametric patterning method refers to the method of automatically producing patterns by entering all the formulas necessary to draw patterns into the computer and then substituting numerous human size measurements obtained through three-dimensional human measurements, etc. That is, in the parametric patterning method, the patterns of the basic components that make up the ordered garment may be divided into multiple points, and the relationships between the multiple points may be defined by functions. Then, depending on the size of the garment, the basic patterns of the basic components may be resized flexibly. This parametric patterning method is easy to verify that the entered pattern equation is suitable for the human body of various dimensions. In addition, once proven patterns are used, the grading or fitting process may be omitted.

In the server computer, basic patterns of basic components by size of the ordered garment may be generated. Then, taking into account the basic pattern information generated, it is possible to calculate quantities of the fabric and subsidiary materials necessary to produce the ordered garment according to the order quantity by size. It is also possible to specify the process that must be carried out before sewing for some garment patterns, if necessary.

In the server computer, it is also possible to calculate the working time required to produce each basic pattern once the basic patterns of the ordered garment by dimension are secured. The working time may be calculated based on the aforementioned SMV.

A series of tasks described above, such as generating the basic patterns and calculating the estimated working times, may be performed by the modular pattern classification unit 230 and a garment pattern database 240 to be described later in relation to FIG. 7.

[Modular Detailed Process Determination Step]

In the modular detailed-process determination step 2, work modules 51, 52, and 53 may be designated for each of the garment patterns, and the entire sewing process may be designed including the sewing order of the work modules 51, 52, and 53. In addition, a job instruction sheet for modular process line and a job instruction sheet for a component-joining process line may be generated. The modular detailed-process determination step 2 may be performed by a modular process design unit 260 to be described later in relation to FIG. 7.

Specifically, in the modular detailed process determination step 2, it is possible to determine the working modules 51, 52, and 53 for the basic patterns of the ordered garment, respectively, produced in the garment design step 1. In the present inventive concept, a segmented work process is defined as the work module 51, 52, or 53 to generate the basic components for the joining process. In the example embodiment, the work modules 51, 52, and 53 may be determined by the following criteria: (i) sameness or similarity of the basic components for joining the ordered garment; (ii) sameness of the sewing machines used; (iii) minimization of possible deviations between the total working times for each of the working module 51, 52, and 53, or (iv) criteria for applying some or all of the above-mentioned criteria in duplicate.

In the example embodiment, the work modules 51, 52, and 53 for the basic patterns of the ordered garment may be determined based on the basic components for the joining process by style of the ordered garment. For example, the work module 51, 52, and 53 may be determined for each of the basic components defined by the type and style of the garment in the garment design step 1. Examples of the basic components of a seam-sealing style jacket for the joining may include sleeve, front panel, back panel, collar, hood, placket, zipper, cuff, etc. In other words, the same or similar basic components may be designated as the same working module. If the work modules 51, 52, and 53 are determined based on the basic components, and the linkage and continuity between the module sewing step 5 and the sewing-for-joining-components step 6 comes to be facilitated, making it easier to design the whole sewing process that is described later.

In other example embodiment, the working modules 51, 52, and 53 may be determined by grouping the processes based on whether the same sewing machine is used for the basic patterns of the above-ordered garments. This determination of the work modules 51, 52, and 53 by grouping can minimize the movement of garment manufacturing machine 21 such as sewing machines, thereby improving work efficiency.

In other example embodiments, the work modules 51, 52, and 53 may also be determined by considering the SMV of the smallest unit process. As mentioned above the SMV means the time taken for a standard worker to perform a given task under the specified conditions. More specifically, the work process for each of the basic patterns is subdivided into the smallest unit of the basic processes, and then a SMV of each of the basic processes is calculated. Here, the basic process of the smallest unit may consist of one task, for example, a single process such as 'straight-line sewing using a sewing machine' or 'embroidery'. Subsequently, the total working time for each work module 51, 52, or 53 may be calculated by using the SMV of each basic process. The works for the basic patterns may be grouped such that the smallest deviation occurs between the total working times calculated for respective work modules. The work modules 51, 52, and 53 may be determined in that manner. The SMV is the value affected by the number of workers. Thus, if the number of workers is large, the differentiation of work modules may be further refined. Conversely, if the number of workers is small, the number of basic processes that one worker should perform will increase. If the work modules 51, 52, and 53 are determined by grouping the works for the basic patterns so as to have the smallest deviation between the total working hours of respective work modules 51, 52, and 53, a uniform distribution of human and material resources may be possible for each work process. In addition, efficient process time management may be possible because the basic components can arrive in a timely manner during the sewing-for-joining-components step 6.

In an example embodiment, the working modules 51, 52, and 53 may be designated by applying two or more of the above-mentioned three criteria in combination. As illustrated in FIG. 3, the primary work module 11 may be designated by primary division according to the equality or similarity between the basic components for the joining by the style of the garment. There may be several subprocesses for the primary work module 11. For those subprocesses, the detailed parts of the basic components may be grouped together and designated as the secondary work module 12 if the detailed parts are made by the same sewing machine. There may also be multiple subprocesses for the secondary work module 12. In that case, each of the subprocesses for the secondary work module 12 may be subdivided into basic processes each of which consists of single task. Then, the SMV of each of the subdivided basic processes may be calculated. The module process line may be constructed by grouping the basic processes so that the smallest deviation occurs between the total working times calculated for the work modules 51, 52, and 53. Each modular process line constructed like this may correspond to each of the work modules 51, 52, and 53. In addition, depending on the complexity of garment design, the work modules 51, 52, and 53 may be specified in multiple stages, from the primary module 11 to the $N^{th}$ modules, where N is a natural number greater than 1. Here, each of the $N^{th}$ modules may be a basic process consisting of one task, which may be defined by segmenting the subprocess of the primary module 11.

In an example embodiment, in the server computer, if the working modules 51, 52, and 53 for the basic patterns of ordered garment are determined, a composition of the modular sewing process lines may be designed based on the garment production line operation information. The modular sewing process lines may include a module process line for the production of the determined work modules and a joining process line for the completion of manufacturing the ordered garment by joining the basic pattern products manufactured in each module process line. In other words, the overall composition of the modular sewing process lines for the ordered garment may be designed with comprehensive consideration of the sewing work priorities of the work modules 51, 52, and 53 determined in the modular detailed process determination phase 2 and the joining order (sequence) of the basic patterns.

The production efficiency may vary depending on the manufacturing order (sequence) of the basic patterns that make up the ordered garment. In terms of production efficiency, it is possible to prioritize the production of basic patterns that make up the ordered garment. The order and quantity of the work may be determined by the priority of basic patterns to be produced first, and by similar types and styles. If various styles of garments need to be manufactured, the work modules with similar shapes and assembly orders may be placed for the sewing works in the same module process line. In addition, working modules that can be worked together may be placed on the same module process line.

The fabrication order of the work modules 51, 52, and 53 to produce the basic patterns may be determined in accordance with an assembling order of the basic patterns joined by the joining worker group of the sewing-for-joining-components step 6. Then, the fabrication order of the subdivision step is sequentially determined according to the determined fabrication order of the work modules 51, 52, and 53. In addition, when two or more order garment designs are input at the same time, the work order of the work modules 51, 52, and 53 may be adjusted in consideration of the delivery deadline for each order. The work order may be adjusted so that the priority of the work is given to a part of the work modules 51, 52, and 53 of the garment order whose delivery date arrives first. In addition, the policy for operation of each work module may be decided by considering the working hours for each basic pattern (by work module) calculated based on SMV.

FIG. 3 illustrates an example of the work order of the work modules 51, 52, 53 consisting of the primary and secondary modules 11, and 12. As shown in FIG. 3, when the work modules 51, 52, and 53 that produce the basic patterns are configured in two stages, a work instruction for the secondary module 12 may be made first, followed by the work instruction for the primary module 11. Subsequently, when the sewing work of the primary module 11 is completed, the basic components may be transferred to the component-joining process line for joining work.

When the production of the basic patterns is completed at each module process line, the manufactured basic patterns may be transferred to the joining process line. Here, the sewing-for-joining-components step 6 of the joining process line may be performed for the assembling in order due to the nature of the work. Therefore, it is desirable that the basic patterns produced in respective work module 51, 52, or 53 are transferred to the joining process line in accordance with the joining order listed in a work instruction sheet for the joining process line. Consider a case where the work modules 51, 52, and 53 are configured in stages from the primary module 11 to the N-th module. In this case, the working time of each of the first to N-th modules may be determined such that when the basic patterns are sequentially delivered to the joining-by-sewing process line, the works of the corresponding work modules 51, 52, and 53 can be is completed before the order of sewing the basic patterns to be joined in the sewing-for-joining-components step 6 is reached. In other words, it is desirable that the working time be determined so that production in the first module 11 of the basic pattern can be completed before a sewing-for-joining-components order of any one of the basic patterns in the sewing-for-joining-components step 6 is reached.

In an example embodiment, it may be possible to calculate the most efficient number of processes to be performed in one step or by one worker in terms of work efficiency. Considering the temporal factors such as the sewing operation, alignment and transfer of garments, etc., it is possible to determine the steps for the joining that can complete the sewing operation in the shortest time. When the time for each step for the joining is determined, the working time of the largest module (basic pattern) required in each step may be determined. For example, in the case of a jacket, the work can be done in an order of (1) body upper-front+body upper-back, (2) finished products of step (1)+sleeve, (3) finished products of step (2)+collar (or hood), (4) finished products of step (3)+zipper (front), 5) finished products of step (4)+cuff, and 6) finished products of step (5)+lining, etc.

Therefore, the order in which the basic pattern products arrive may be preferably configured such that the basic pattern products required in the work step (a unit of the sewing-for-joining-components work done by a single worker or a single machine) are arrived. For example, if the first step of joining the components is to join the body front and back panels, the front and back panels should arrive before starting the first step of joining the components. Since the sleeves are required in the second step of joining the components, the sleeve modules should be delivered before the second step. Therefore, the working time for each step of the joining may be determined taking into account both the working time and the transfer time of each upper and lower module for the basic pattern of the step, and shall be equal to or later than the sum of the transfer time and an ending time of the work for the first module 11 of the basic pattern. This is because the basic pattern productions of the modular unit needed for step-by-step works for the joining can be timely delivered to each joining step.

In other example embodiment, it is desirable to design module process lines so that the deviation between the working hours required to complete the basic pattern works required for the components-joining in the module process lines is within ±5%.

The entire sewing process design made in the modular detailed process determination step 2 of this invention may be performed by AI based on big data. The order of sewing-for-joining the large components may be generally determined by the type and shape of the garment (style). However, the order and method of sewing-for-joining the detailed components may be done in various ways. For example, there are many cases where it is more efficient to join the basic pattern works of any component first even in the joining step, so it is not possible to know what the most efficient case is without comparing the actual works in various orders. Therefore, it is important to identify the most optimal joining order, that is, fast and error-free joining order by varying the modularization method (step, sequence of work, etc.) and the joining order depending on the type and style of garment (or for each module). However, it used to be just relying on the experience of experienced workers. In an example embodiment, in order to determine the optimal sewing process sequence, the modularization methods, and sewing orders which were used according to the type and style of garments (or for work module) may be databased. And, when the type and style of garments are determined and the pattern is determined based on the database, the optimal working order can be found by the AI according to the pattern.

To this end, the server computer 23 may include AI based on big data. In addition, in the production preparation line, the module process line and the joining process line, a facility sensor 22 capable of monitoring the power consumption of the garment manufacturing machine 21 of each process line, or a worker sensor (24) that can measure the worker's working time and working characteristics, or both of the sensors 22 and 24 may be provided.

Figure 4:
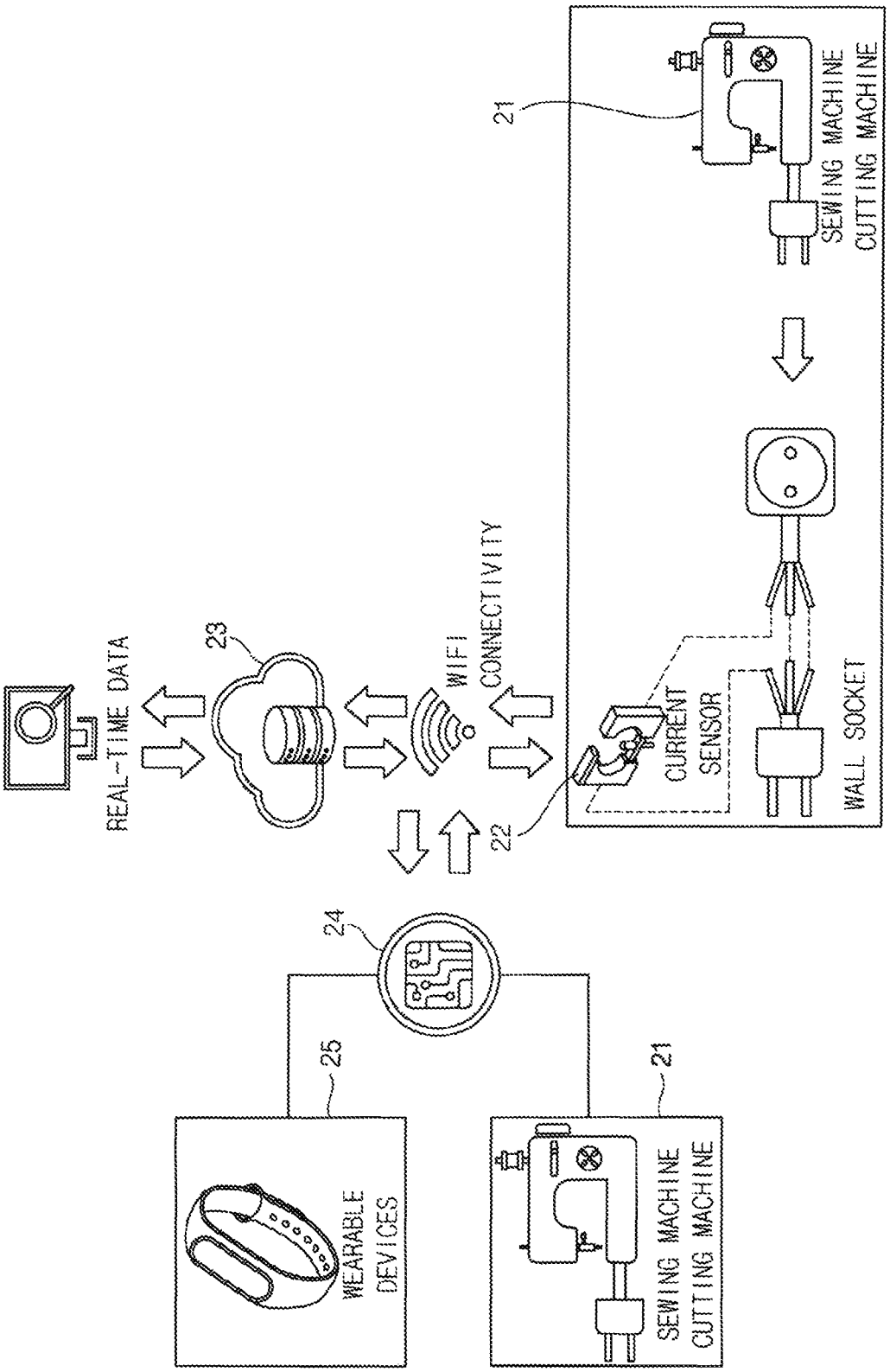
FIG. 4 shows a schematic diagram of a system for data collection and analysis according to an example embodiment of the present inventive concept.

As shown in FIG. 4, the facility sensor 22 may be provided to monitor the power consumption of the garment manufacturing machine 21 of each process line and transmit the power consumption to the server 23 in real time. The worker sensor 24 may be attached to the garment manufacturing machine 21 or be provided in a wearable device that can be worn by an operator. Like the facility sensor 22, the worker sensor 24 may be also provided to measure the worker's working time and work characteristics and transmit measurement data to the server 23 in real time. The server 23 may receive power consumption and failure of the entire garment manufacturing machine 21 from one or more of the facility sensor 22 and the worker sensor 24 in real time. The AI based on the big data may compare the data received from the facility sensor 22 and the worker sensor 24 with the existing accumulated data, to analyze a defect rate, an arrangement order of the machines for each garment manufacturing situation, a delay time for each process, the work characteristics for each worker, and to propose an optimal overall sewing process in real time as a result of the analysis In one example embodiment of the process design by the big data-based AI, the big data-based AI may compare and analyze the data received from the server 23 with the accumulated existing data and determine the defect rate for each process. Through this, it is possible for the big data-based AI to adjust the process order so that the defect rate is minimized, or to suggest that the existing machines or workers worker be replaced by high-quality machines or workers with excellent work ability. For example, if the cause of the defect is a modular process order problem, it may be suggested to adjust the process order as illustrated in FIG. 5. If the defect is caused by machine quality or worker's ability problem, it may be possible to propose replacement with high-quality machine or workers with excellent work ability.

Figure 6:
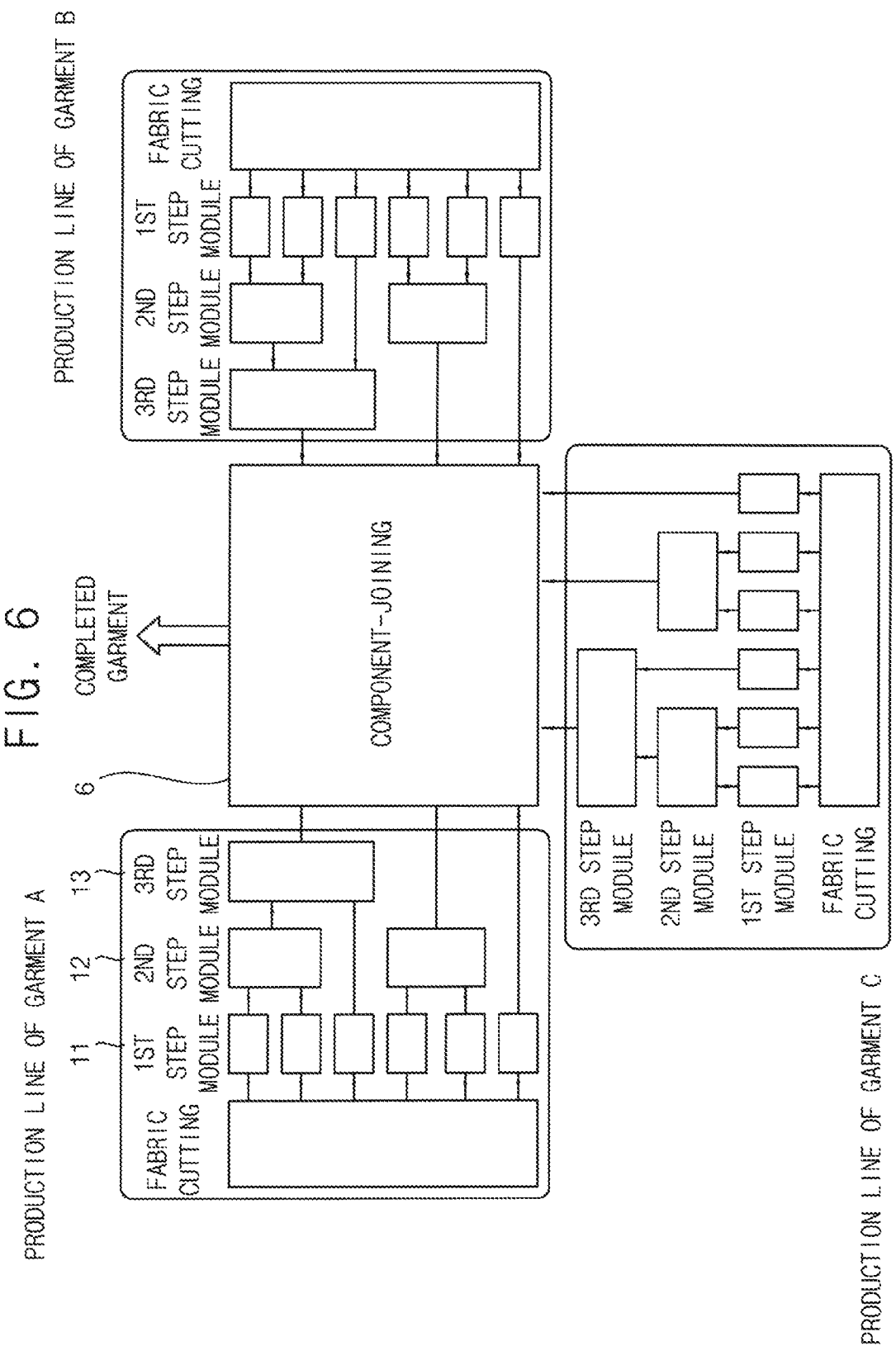
FIG. 6 shows an example of a process layout proposed by AI based on big data according to an example embodiment of the present inventive concept.

In another example embodiment of the process design by the big data-based AI, the big data-based AI may compare and analyze the data received from the server 23 with the existing accumulated data, and suggest the optimal arrangement of the garment manufacturing machine 21 or the worker according to the ordered garment design. In this case, it is preferable that the garment manufacturing machine 21 such as a cutting machine or a sewing machine may be mounted on a wheel or a movable panel so that it can move flexibly. As such, since the garment manufacturing machine 21 can be freely moved within the factory, it is possible to quickly construct the arrangement proposed by the AI based on big data. Also, as shown in FIG. 6, when two or more garments are produced at the same time, the optimum placement of the garment production machines 21 or the workers may be suggested considering the available date for each garment design, the shape/structure of the target garment, the development work time and ability, etc.

In further another example embodiment of the process design by the big data-based AI, the AI may compare the data received from the server 23 with the existing accumulated data to analyze the delay time for each process, and propose the optimal manpower placement by adjusting the input number of workers for each process to minimize the delay time for each process.

In further another example embodiment of the process design by the big data-based AI, the big data-based AI may compare and analyze the data received from the server 23 with existing accumulated data to derive work patterns of workers, defect rates, etc. and determine the worker's work ability. There may be cases where prompt work is needed due to the impending delivery date, or where a small amount of customized products requiring high quality are required to be produced. To ensure that workers suitable for the particular situations are placed in the corresponding process, it is possible to propose the number of persons to be deployed in the production preparation step 3, the module sewing step 5, and the sewing-for-joining-components step 6, based on the pre-determined work capability of the workers.

On the other hand, if the overall configuration of the modular sewing process lines for the ordered garment is designed, it may be able to generate and output job instruction sheet for each of the modular sewing process lines according to the overall configuration. Specifically, in the modular detailed process determination step 2, it is possible to generate a job instruction sheet for the modular process line describing a sewing method for each work module 51, 52, or 53 and a job instruction sheet for the module joining process line describing the works to be performed in the module joining process line. The job instruction sheet for the modular process line may include detailed descriptions of fabrics and subsidiary materials, sewing methods, sewing order, etc. required for the basic components assigned to the corresponding module. The job instruction sheet for the component-joining process line may include detailed descriptions for the sewing-for-joining-components step 6 and the joining work for each step. In addition, the job instruction sheet for the modular process line and the job instruction sheet for the component-joining process line may include design (for the entire and/or parts), fabric information, material information, size of each part, history of design information, final work requirements, etc. along with the sewing method and the order of sewing. The job instruction sheet for each modular sewing process line may be delivered online or offline to the workers of each modular sewing process line.

[Production Preparation Step]

According to the required amount of fabric and auxiliary materials calculated in the garment production step, the fabric and auxiliary materials can be procured and transferred to a production preparation line. Specifically, if the overall configuration of the modular sewing process lines of the ordered garment is designed, the amount of required fabric cuts and subsidiary materials for sewing works may be calculated for each modular sewing process line. Information on the amount of fabric cuts and subsidiary materials required for each sewing process line may be transmitted to a computing device in the fabric and subsidiary warehouse. Accordingly, as many fabric cuts and subsidiary materials as necessary for each sewing process line may be supplied from the fabric and subsidiary warehouse.

In the production preparation line, if the amount of ordered garments using the same fabric is much enough to be cut at once, making a marker may be started. However, if the ordered garment is not so much amount to be cut at once but the guaranteed lead time is reached, making the marker may be started. Here, the process of arranging the garment pattern on the fabric is called marking, and the set of the garment patterns arranged in this way is called a marker. The marking process is a very complex process that requires minimization of unused and discarded fabric, determination of the cutting order considering the size or shape of the pattern, and arrangement to avoid defects in the fabric. In small quantity batch production, it may be very important to collect and cut out the patterns using the same fabric among the patterns constituting the ordered garments, and to manage the cut patterns so that they do not mix with each other.

In an example embodiment, identifications (IDs) may be marked on the patterns cut from the same fabric and subsidiary materials required at each step so as not to be confused in a subsequent module process line.

The fabric cuts and auxiliary materials prepared in the production preparation line may be packaged and accurately transferred to the module process line. The package may also be marked with an ID in the same way as fabric cuts or subsidiary materials to prevent confusion when transferring to the module process line. The transfer from the production preparation line to the module process line may be performed automatically by a conveyor system or transfer robot, or may be performed by workers.

[Pre-Sewing Step]

In an example embodiment, the fabric cuts and subsidiary materials for some garment patterns for which a process to be performed before sewing is specified in the garment design step 1 may be transferred to the pre-sewing line to perform the pre-sewing work. Examples of the pre-sewing works may include embroidery, printing, quilting processes, etc. In the pre-sewing line, a job instruction sheet for the pre-sewing line may be displayed first by scanning the ID marked on the package. The pre-sewing works may be performed by the garment manufacturing machine 21 installed in the pre-sewing line. The pre-sewing works may be performed manually by a worker, but is preferably performed automatically by the automated garment manufacturing machine 21.

[Module Sewing Step]

The fabric cuts and subsidiary materials prepared in the production preparation step 3 or in the pre-sewing step 4 may be transferred to the module process line of the pre-specified work modules 51, 52, or 53. In each module process line, the fabric cuts and the subsidiary materials may be sewn according to the job instruction sheet of the module process line by the garment manufacturing machine 21 provided in the module process line, thereby producing the basic pattern products.

When the package made of the cut fabrics and subsidiary materials is transferred to the module process line, the worker first scans its identification (ID) displayed on the package, and thus can check the displayed job instructions for the module process line. Workers placed on the module process line may produce the basic patterns by sewing the transferred fabric cuts and subsidiary materials using the garment manufacturing machine 21 according to the job instructions for the module process line. The sewing operation in the module process line may be performed manually by the workers, or preferably may be automatically performed by the garment manufacturing device 21. The basic components produced in each module process line may be marked with identification information to avoid confusion. The identification information may be marked using a barcode/QR code printing device or an RFID tag automatic attachment device. The identification information may include an indication that represents the order of component joining works in the component joining process line.

[Sewing-for-Joining-Components Step]

In the module sewing step 5, the basic components produced in the module processing line of each work module 51, 52, or 53 may be transferred to the component-joining process line. The transfer from each module processing line to the component-joining process line may be automatically performed by a conveyor system or a transfer robot, or may be manually by a worker. The component-joining work may be the work of a completion step in which the basic patterns partially joined or assembled may be finally joined. For the component-joining work, the sewing operations of several steps may be performed in chronological order. That is, the basic pattern products transferred to the component-joining process line may be joined in accordance with an assembly order described in the job instruction for the component-joining process line. The assembly order may already be defined for each type and style of garments in the garment design step 1. Therefore, it is more preferable that the basic pattern products completed in each module processing line are delivered to the component-joining process line in accordance with the assembly order. In other words, it is more efficient that basic patterns are provided based on the step for the component-joining works.

[Finishing Step]

After the sewing-for-joining-components step 6, the joined garment may be transferred to a finishing process depending on its type. In the finishing process, operations such as ironing, inspection, and packaging are performed.

[Modularized Garment Manufacturing System for Small Quantity Batch Production of Garments]

In the manufacturing method of a modular garment according to the example embodiment of the present inventive concept described above, the garment design step 1, the entire process of the modular detailed process determination step 2, and some of the processes of the production preparation step 3 may be implemented as computer programs that can be run by a computer device. FIG. 7 illustrates a configuration of a modularized garment manufacturing system 100 in accordance with an example embodiment of the present inventive concept.

Figure 7:
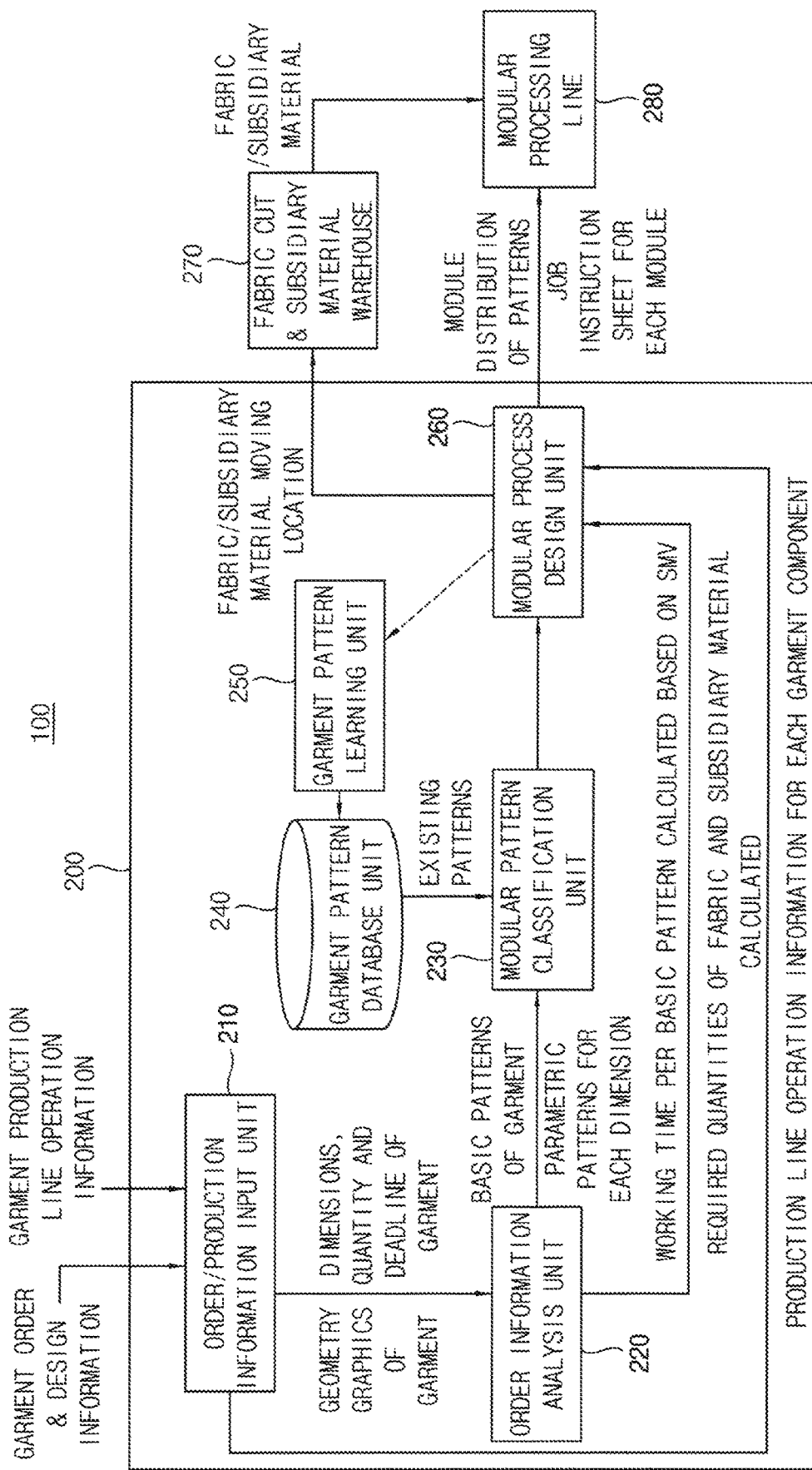
FIG. 7 illustrates a block diagram showing a configuration of a modular garment manufacturing system according to an example embodiment of the present inventive concept.

Referring to FIG. 7, the modular garment manufacturing system 100 of the present inventive concept may include a production preparation line, which includes a server computer 200, and a warehouse 270 for storing fabric cuts and subsidiary materials, and modular sewing process lines including the module processing line and the component-joining process line. The server computer 200 may include an order/production information input unit 210, an order information analysis unit 220, a modular pattern classification unit 230, a modular process design unit 260, and a garment pattern database unit 240. Each of these units may be implemented as independent program modules respectively, or as a combined single program module.

The order/production information input unit 210 may receive design information of ordered garment provided by an orderer. The design information may include graphic data representing the shape and type of the ordered garment. The order/production information input unit 210 may also receive information such as dimensions, volume of order, delivery date, etc. of the ordered garment. In addition, the order/production information input unit 210 may also receive detailed information about the garment production line currently being operated in a factory. The information provided to the server computer 200 may include, for example, information on how many production lines are currently operating for each component of garment.

The order information analysis unit 220 may analyze the entered design information to determine the basic components of the garment design in consideration of the subsequent component-joining process. The order information analysis unit 220 may automatically generate basic patterns for each dimension of the ordered garment based on the garment pattern database unit 240. The patterns for each dimension of the ordered garment may be automatically generated through the parametric patterning method. The order information analysis unit 220 may calculate the amount of fabric and the amount of subsidiary materials required to produce the ordered garments according to the volume of order for each size in consideration of the generated basic pattern information. Furthermore, the order information analysis unit 220 may calculate a working time required to manufacture each of the basic patterns when the basic patterns for each dimension of ordered-garments are secured. This working time may be calculated based on the aforementioned SMV.

In addition, if it is necessary to perform a process that needs to be performed in advance, such as embroidery, printing, and quilting processes for certain garment patterns, a garment design unit may designate a pre-sewing work for the corresponding garments patterns.

The modularization pattern classification unit 230 may classify and designate the basic patterns of the ordered garment generated by the order information analysis unit 220 into appropriate module processes, respectively, based on the reference patterns stored in the garment pattern database 240. That is, the modularization pattern classification unit 230 may compare, in terms of similarity, a plurality of basic patterns provided by the order information analysis unit 220 with the reference garment patterns stored in the garment pattern database unit 240. Through this, a pattern category of each of the plurality of basic patterns may be determined. According to an example embodiment, patterns of general garments input to the garment pattern database unit 240 may be learned as the reference patterns using supervised machine learning methods such as a neural network based machine learning algorithm, or a support vector based machine learning algorithm. Furthermore, by comparing the basic patterns generated by the analysis of the order information with the reference patterns, it is possible to determine which module the basic pattern is closest to and classify it into the corresponding module.

The modular process design unit 260 may determine subdivided work modules for each of the plurality of basic patterns. This determination may be made based on the pattern category determination result of the plurality of basic patterns provided from the modular pattern classification unit 230 and information on the currently operating garment production line provided by the order/production information input unit 210. Furthermore, the configuration of the modular sewing process lines may be designed based on the operation information of the garment production line. The modular sewing process lines may include the module processing line for manufacturing the work modules determined and the component-joining process line for completing production of the ordered garment by joining the basic pattern products produced in each module processing line.

Specifically, the modular process design unit 260 may receive information on the reference patterns determined from the modular pattern classification unit 230. The modular process design unit 260 may designate the work modules 51, 52, and 53 for each of the garment patterns, and then design an entire sewing process including the sewing order of the work modules 51, 52, and 53. Afterwards, the modular process design unit 260 may generate a job instruction sheet for the module process line in which detailed sewing method for each of the work modules 51, 52, and 53, and a job instruction sheet for the component-joining process line in which an order of component-joining and a method of component-joining for the base components produced in each of the work modules 51, 52, 53. Also, regarding the garment patterns for which pre-sewing works are designated, the modular process design unit 260 may generate a job instruction sheet for the pre-sewing line, in which detailed work instructions for the pre-sewing work are described.

The server computer 200 may further include a garment pattern learning unit 250. The garment pattern learning unit 250 may receive information on the finally determined basic patterns from the modular process design unit 260 and learn each basic pattern as a reference pattern based on the machine learning method. The garment pattern learning unit 250 may reflect results of the machine learning in the garment pattern database unit 240.

Referring to FIG. 4, one or more of the facility sensor 22 and the worker sensor 24 may be provided in the production preparation line, the module processing line, and the component-joining process line of the modular garment manufacturing system of the present inventive concept. The facility sensor 22 may be installed in the garment manufacturing machine 21 of each process line and can monitor the power consumption of the garment manufacturing machine 21. The worker sensor 24 may be installed in the garment manufacturing machine 21 or be provided in a wearable device that may be worn by a worker, and can measure a working time and work characteristics of the worker. At least one of the facility sensor 22 and the worker sensor 24 may be connected to the server computer 23 via a wireless network, so that the power consumption and failure of the garment manufacturing device 21, and the line state including the worker's working time can be transmitted to the server computer 23 in real-time. The modular process design unit 260 may include AI based on big data. The AI based on the big data may compare and analyze the data received from the facility sensor 22 and the worker sensor 24 with accumulated existing data to suggest a sewing process sequence, or replacement or placement of the garment manufacturing machine 21 or the worker. Here, the server computer 23 shown in FIG. 4 may be substantially the same as the server computer 200 shown in FIG. 7.

In a specific example embodiment, the modular process design unit 260 may propose to adjust the sewing process sequence or to replace the equipment or worker with other high-quality equipment or worker with excellent work ability by comparing the data received from the server 23 with the accumulated existing data and analyzing the data. This is to minimize the defect rate. In another example embodiment, the modular process design unit 260 may propose an optimal arrangement of the garment manufacturing machines 21 or workers according to the ordered garment design by comparing and analyzing the received data with accumulated existing data. The garment manufacturing machine 21 may be mounted on a wheel or a movable panel so that it can be flexibly moved according to the optimal arrangement.

In further another example embodiment, the modular process design unit 260 may compare the data received from the server 23 with the existing data accumulated in the database unit 240) to analyze the delay time for each process, and to propose the optimal manpower allocation for each process by judging suitability of the number of workers to be put in so as to minimize the delay time for each process.

In further another example embodiment, the modular process design unit 260 may compare the data received from the server 23 with the existing accumulated data to determine work capabilities of workers, and candidates of workers may be proposed for each of the production preparation line, the module processing line and component-joining process line, based on the determined work capabilities of workers.

[Production Preparation Line]

If the amounts of the fabrics and subsidiary materials calculated by the garment design unit are procured, the procured fabrics and subsidiary materials may be directly transferred to the production preparation line. The production preparation line may be equipped with a computer (including software) and a marker system having a plotter configured to cut the fabrics. In the production preparation line, a marker operation for putting the design drawings of the cut objects to be cut into a size of the fabric may be performed using the computer software based on the information on the garment patterns received from the garment designing unit. Then, the patterns may be printed on an actual fabric-sized paper by a plotter can then be used to print. Then, a prepared number (1 to several) of the fabrics may be cut using a cutting machine along with the paper cut. After the cutting work, the fabric cuts and subsidiary materials may be packaged according to the work modules 51, 52, and 53 designated by the modularization determining unit.

In addition, the production preparation line may be equipped with a device capable of marking identification information (ID) for preventing confusion. Example of the device capable of marking the identification information (ID) may be a barcode/QR code printing device or an RFID tag automatic attachment device. By utilizing the device, a barcode/QR code may be displayed as identification information (ID) on the cut fabric and subsidiary materials, or an RFID tag may be attached thereto. The identification information ID may be displayed on the package. In the identification information ID, whether or not to perform the pre-sewing work may be displayed together.

The packages may be transferred to the module processing line of each work module 51, 52, or 53 according to the provided identification mark (ID). The transfer from the production preparation line to the module processing line may be automatically performed by the conveyor system or the transfer robot, or may be carried by a person.

[Pre-Sewing Line]

As being designated the pre-sewing work in the garment design unit, the fabric cuts and subsidiary materials or their packages marked to perform the pre-sewing work on the identification mark (ID) may be first transferred to the pre-sewing process line before being transferred to the module processing line. The pre-sewing process line may be equipped with a device that can scan the fabric cuts and subsidiary materials, or identification marks (IDs) marked on their packages. When the worker scans the identification information (ID), a job instruction sheet for the pre-sewing line may be displayed on a monitor provided in the pre-sewing line. The pre-sewing works, such as embroidery, printing, quilting processes, etc. may be performed on the fabric cuts or subsidiary materials transferred to the pre-sewing line according to the work content and order described in the job instruction sheet for the pre-sewing line. The pre-sewing work may be performed manually by the worker, or may be automatically performed by the garment manufacturing machine 21.

[Module Processing Line and Component-Joining Process Line]

The fabric cuts and subsidiary materials of work in the production preparation line or the pre-sewing process line is completed nay be transferred to the module processing line of the designated work module 51, 52, or 53 according to the identification information (ID) displayed on the package. The worker may perform a sewing work to produce basic components according to the job instruction sheet for the module processing line represented on the display provided on the module processing line. The basic components produced may be transferred to a pre-specified component-joining process line, where the component-joining may be achieved.

The garment manufacturing machines 21 and the workers suitable for performing each designated work may be disposed on the module processing line and the component-joining process line. In addition, the module processing line and the component-joining process line may be equipped with a scanner capable of scanning an identification information (ID) displayed on the package or fabrics (and/or subsidiary materials) and a display capable of displaying the job instruction sheet. The worker may perform a sewing work according to the job instruction sheet displayed on the display. The garment manufacturing machine 21 provided in the module processing line and the component-joining process line may be an apparatus operated manually by a worker or an automated apparatus operated only by a simple operation by the worker. In addition, the module processing line may be equipped with a device, for example, the barcode/QR code printing device or the RFID tag automatic attachment device, capable of marking the identification mark (ID) on the basic components produced by the module processing line.

Figure 8:
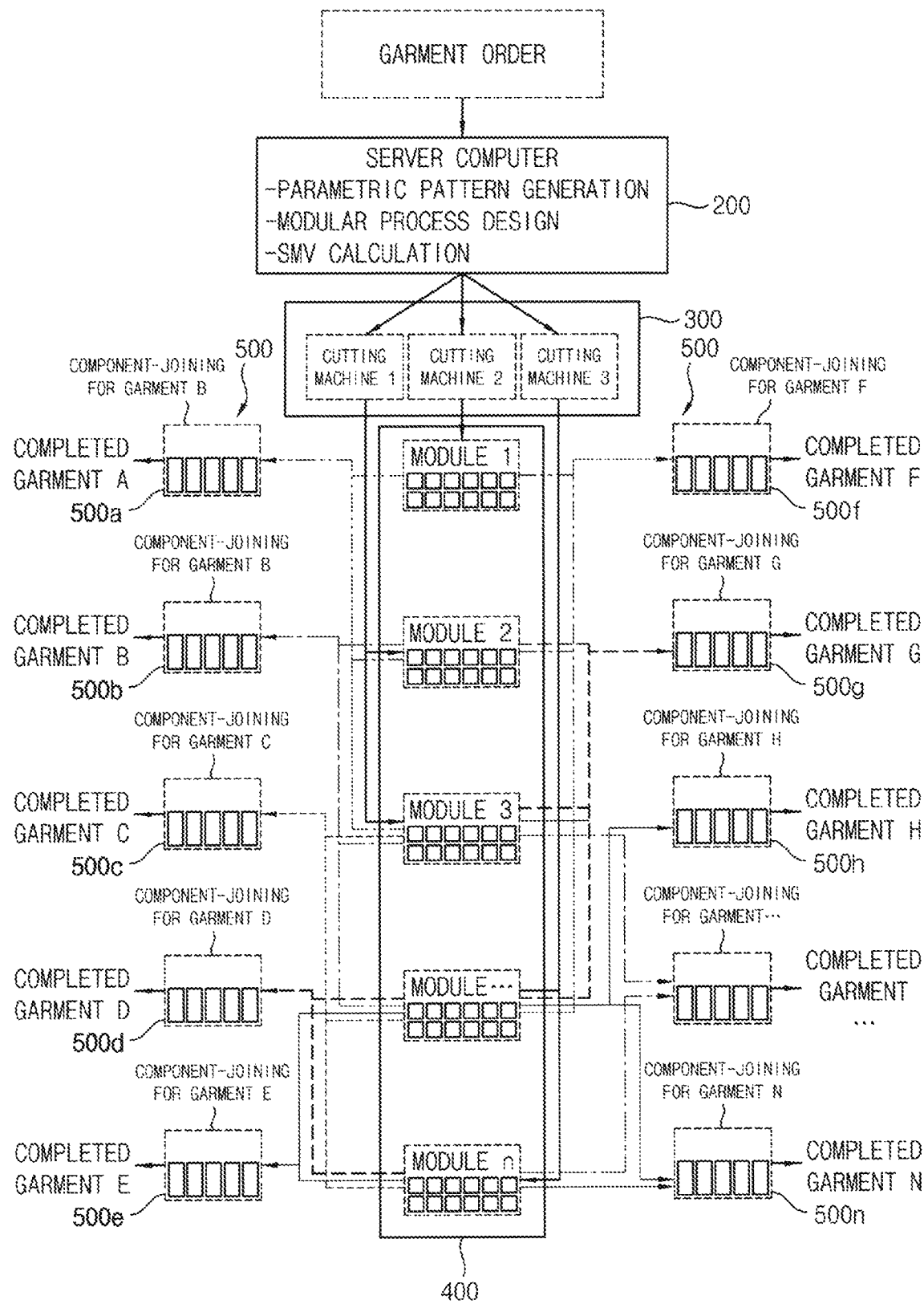
FIG. 8 shows an example of the configuration of modular sewing process lines according to an example embodiment of the present inventive concept.

FIG. 8 illustrates a configuration example of modular sewing process lines according to an example embodiment of the present inventive concept.

Referring to FIG. 8, the features and advantages of the small quantity batch production method utilizing the module processing line 400 and the component-joining process line 500 will be described. The cutting machine 300 may include, for example, three cutting machines 1, 2, and 3. The cutting machines 1, 2, and 3 may cut fabrics required for manufacturing the ordered garment for each style received from the server computer 230. The fabric cuts may be sent to n module processing lines (modules 1, 2, 3, . . . , and n) 400. The cutting unit may be flexibly determined from several to several tens of fabric sheets, which are necessary to meet a small quantity of order, rather than hundreds to thousands of fabric sheets.

The cutting machines 1, 2, 3 may be assigned to the module processing lines (module 1, 2, 3, . . . , n) 400. The cutting machines 1, 2, 3 may not always cut the same amount of fabrics. The server computer 200 may determine and transmit the amount of fabric sheets to be processed by each cutting machine 300 so as to minimize variation between the working times of the cutting machines 1, 2, and 3.

The module processing lines (modules 1, 2, 3, . . . n) may be divided according to the basic components for component-joining. The work modules may be grouped and distributed to each module process line 400 so that each work module group can be worked by a process using the same sewing machine. Let's consider, for example, a configuration of the module processing line according to the basic components for joining components into a jacket with a hood. Jackets with hoods may be divided into modules such as a sleeve, a front panel, a back panel, collars, hoods, zippers, etc. An exemplary configuration of the module processing line for joining these modules is as follows. For example, when the finished garment A is a hood jacket, as illustrated in FIG. 3, a hood, the front panel, and the like may be regarded as one module. The hood may be produced in module 1, the front panel in module 2, the back panel in module 3, the sleeve in module 4, the collar in module 5, and the zipper in module 6, respectively. Furthermore, by moving the modules 1, 2, 3, 4, 5, and 6 to the component-joining process line 500a for the finished garment A, the garment A may be completed through the component-joining process.

In conjunction with the modularization of garment A, consider the case where the garment B is a hooded jacket that includes an inner padding. In this case, the inner padding may be worked in module 7, and the work result of module 7 may be transferred to the component-joining process line 500b of garment B together with the modules 1, 2, 3, 4, 5, and 6. Then, the modules 1, 2, 3, 4, 5, 6 and 7 may be joined, thereby completing garment B.

In connection with the modularization of garment A, consider the case where garment C is a hooded vest without sleeve. In this case, except for module 4 for manufacturing the sleeve, the remaining modules 1, 2, 3, 5, and 6 may be transferred to the component-joining process line 500c for garment C to perform the component-joining. Through this, garment C can be completed.

In connection with the modularization of garment A, consider the case where garment D is a vest without a hood. In this case, except for module 1 for manufacturing the hood, the remaining modules 2, 3, 4, 5, and 6 may be transferred to the component-joining process line 500d for garment D to perform the component-joining. Through this, garment D can be completed.

When the jacket is designed and ordered in slightly different styles in this way, a very efficient production can be achieved by configuring the module processing line 400 and the component-joining process line 500 in the same manner as above.

Meanwhile, the modules may be grouped based on a process using the same sewing device. For example, a basic sewing machine, a lock stitching machine, a seam sealing machine, a buttonhole machine, and the like can perform a task that does not depend greatly on the type or style of the garment. In grouping the modules by a process using the same sewing device, since in connection with the basic components for the component-joining, the sewing machine used to manufacture the corresponding component is the same, the modules can be automatically grouped into the same sewing device.

In an example embodiment, SMV of each unit process in each module process line (module 1, 2, 3, . . . , and n) 400 and each component-joining process line 500 may also be considered. In FIG. 8, the unit processes of the module process line 400 and the component-joining line 500 are indicated by a quadrangle (□), and mean a worker and equipment performing each unit process. By measuring the SMV of all unit processes, it can be done to minimize the variation in working time for each module and component-joining process. In the SMV measurement of the unit process, the working time of the workers may be manually measured using a stopwatch, or the time per unit work may be derived by analyzing the signal measured from the power (current) sensor installed in the machine for the unit work using a machine learning technique such as convolutional neural network (CNN).

The SMV of the unit process may also be applied as a criterion for determining the number of workers for each module and each component-joining process. For example, when garment A is a hooded jacket, module 1 is a hood, module 2 is a front panel, module 3 is a back panel, module 4 is a sleeve, module 5 is a collar, and module 6 is a zipper, it is needed that modules 1, 2, 3, 4, 5, and 6 manufactured in each module processing line should arrive at component-joining process 500a for garment A at the same time in order to proceed with the component-joining process for garment A. Actually, however, the production SMV for each module may be different. For example, when the production SMVs for one hood of module 1, one front panel of module 2, one rear panel of module 3, one sleeve of module 4, one collar of module 5, and one zipper of module 6 are 2 minutes, 1 minute, 1 minute, 2 minutes, 1 minute, and 2 minutes, respectively, the number of workers for manufacturing each of the hood of module 1, the sleeve of module 4, and the zipper of module 6 may be doubled compared to the number of workers for manufacturing the front panel of module 2, the rear panel of module 3, and the collar of module 5. With this arrangement, all the modules can arrive in the component-joining process for garment A at about the same time.

In addition, when the component-joining times of garments A, B, and C are for example 2 minutes, 4 minutes, and 1 minute, respectively, operation of the component-joining process lines may be flexibly adjusted according to delivery and quantity to work in order to support the component-joining process line 500b for garment B having a long production SMV. For example, the component-joining process line 500c for garment C may be operated as the component-joining process line for the production of garment B for several days, and then returned again as the component-joining process line for garment C.

When ordering a new style of garment, a SMV for each module required to produce the new style garment may be additionally calculated to be applied to production by determining an operation rate for each module and component-joining process.

[Finishing Process Line]

The garments produced in the component-joining process line may be transferred to the finishing process line such as ironing, inspection and packaging as necessary to finish the work.

INDUSTRIAL APPLICABILITY

The present inventive concept can be used in the garment manufacturing industry, and in particular it can be utilized in garment sewing factories that require a small amount batch production method.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A modularized garment manufacturing method for producing a garment by using a computer program which is run by a first computer device, comprising:
    generating a plurality of basic components constituting an ordered garment by analyzing shape graphic data of the ordered garment;
    generating basic patterns for each dimension of the ordered garment for each of the plurality of basic components;
    classifying a pattern category of each of the plurality of basic patterns by comparing the plurality of basic patterns with reference garment patterns stored in a garment pattern database in terms of similarity;
    determining work modules subdivided for each of the plurality of basic patterns based on classification result of the pattern category of the plurality of basic patterns and information on a garment production line currently in operation; and
    designing a configuration of modular sewing process lines based on operation information of a garment production line which includes module processing lines for manufacturing the determined working modules and a component-joining process line for completing production of the ordered garment by joining the basic pattern products produced in each of the module processing lines.

2. The method of claim 1, further comprising generating a job instruction, in the first computer device, for each process line based on the overall configuration of the modular sewing process lines to be output for printing, so that basic pattern product produced in each of the module processing lines is delivered to the component-joining process line in order according to a joining order specified in the job instruction for the component-joining process line.

3. The method of claim 1, further comprising calculating, in the first computer device, information on amounts of fabric cuts and subsidiary materials required for sewing operation for each process line of the modular sewing process lines to be transferred to a second computing device for a warehouse of fabric cuts and subsidiary materials, so that the fabric cuts and subsidiary materials in the warehouse can be supplied as much as needed to each process line.

4. The method of claim 1, wherein identification of the plurality of basic components for generating the basic patterns is made by scanning shape graphic data of the ordered garment and classifying scanned shape graphic data for each basic component based on a shape recognition algorithm.

5. The method of claim 1, wherein the basic patterns for each dimension of the ordered garment are generated by a parametric patterning method that divides a pattern of each of the basic components constituting the ordered garment into a plurality of points and functioning relationships between the plurality of points, thereby flexibly adjusting dimension of a basic pattern of each of the basic components according to garment sizes.

6. The method of claim 1, further comprising calculating a working time, in the first computer device, required to manufacture each of the generated basic patterns for each dimension in the first computer device; and calculating a total working time, in the first computer device, for each work module, wherein determination of the work modules is made by grouping works for the basic patterns so as to resulting in a smallest deviation between calculated total working times for work modules.

7. The method of claim 6, wherein the working time is calculated based on a standard minute value (SMV).

8. The method of claim 1, further comprising calculating an amount of fabrics and an amount of auxiliary materials required to produce the ordered garment according to an order, in the first computer device, using information on size and a volume of order of the ordered garment.

9. The method of claim 1, further comprising learning a reference garment pattern for each component of a garment, in the first computer device, based on a predetermined machine learning algorithm using general garment pattern data as learning data; and classifying learned reference garment patterns by garment and by pattern category, in the first computer device, to be stored in the garment pattern database.

10. The method of claim 1, wherein determination of the work modules is made based on one criterion or combined two or more criteria out of (i) sameness or similarity of the basic components for component-joining of the ordered garment, (ii) sameness of sewing machines to be used, and (iii) minimization of deviations between working times of the working modules.

11. The method of claim 1, wherein configuration of the module processing lines is designed based on sewing work priority of the determined work modules and component-joining order of the plurality of basic patterns.

12. The method of claim 11, wherein the sewing work priority is determined based on an order of delivery deadline.

13. The method of claim 11, configuration of the module processing lines is designed such that works for work modules having similar shapes and joining orders and/or work modules that can worked jointly are performed in a same module processing line.

14. The method of claim 1, wherein the designing comprises: grouping the plurality of basic patterns of the ordered garment for each style of garment based on similarity of the basic patterns for component-joining to designate each group of the basic patterns as a first module; grouping sub-processes of the first module based on sameness of sewing devices used to designate each group of the sub-processes as a secondary module; when there are a plurality of sub-processes of the secondary module, subdividing each sub-process of the secondary module into basic processes each of which is composed of one operation; calculating a total working time for each work module in consideration of standard minute value (SMV) of each of the subdivided basic processes; and forming the module processing lines by grouping the basic processes so that the deviation between the calculated total working times for the work modules is the smallest.

15. The method of claim 1, wherein the module processing lines are designed such that a deviation between working times taken to complete basic pattern products required for component-joining in the module processing lines is within ±5%.

16. The method of claim 1, wherein the work module is configured in stages from a first module divided according to the basic components to an N-th module each of which is composed of basic processes each of which consists of one operation by subdividing sub-processes of the first module, and wherein working times of the first to the N-th modules are respectively determined so that production of each basic pattern product is completed before a turn to sew each of basic pattern products produced for the first module arrives.

17. The method of claim 1, the garment pattern database is constructed by synthesizing data collected from existing garment production process, review data of professional designers, and data collected by monitoring garment production facilities.

18. A modular garment manufacturing system for small quantity batch production of garments, comprising a first computer device that comprises:
 an order/production information input unit configured to generate a plurality of basic components constituting an ordered garment by analyzing shape graphic data of the ordered garment;
 an order information analysis unit configured to generate basic patterns for each dimension of the ordered garment for each of the plurality of basic components;
 a modular pattern classification unit configured to classify a pattern category of each of the plurality of basic patterns by comparing the plurality of basic patterns with reference garment patterns stored in a garment pattern database in terms of similarity; and
 a modular process design unit configured to determine work modules subdivided for each of the plurality of basic patterns based on a result of determining the pattern category of the plurality of basic patterns and information on a garment production line currently in operation, and to design a configuration of modular sewing process lines based on operation information of a garment production line which includes module processing lines for manufacturing the determined working modules and a component-joining process line for completing production of the ordered garment by joining the basic pattern products produced in each of the module processing lines.

19. The system of claim 18, wherein the modular process design unit is further configured to generate a job instruction for each process line based on the overall configuration of the modular sewing process lines to be output for printing, so that basic pattern product produced in each of the module processing lines is delivered to the component-joining process line in order according to a joining order specified in the job instruction for the component-joining process line.

20. The system of claim 18, wherein the modular process design unit is further configured to calculate information on amounts of fabric cuts and subsidiary materials required for sewing operation for each process line of the modular sewing process lines to be transferred to a second computing device for a warehouse of fabric cuts and subsidiary materials, so that the fabric cuts and subsidiary materials in the warehouse can be supplied as much as needed to each process line.

21. The system of claim 18, wherein the order information analysis unit identifies the plurality of basic components, for generating the basic patterns, by scanning shape graphic data of the ordered garment and classifying scanned shape graphic data for each basic component based on a shape recognition algorithm.

22. The system of claim 18, wherein the modular process design unit is further configured to design the module processing lines by calculating a working time required to manufacture each of the generated basic patterns for each dimension, a total working time for each work module, and determining the work modules in a manner of grouping works for the basic patterns so as to resulting in a smallest deviation between calculated total working times for work modules.

23. The system of claim 18, wherein the order information analysis unit is further configured to calculate an amount of fabrics and an amount of auxiliary materials required to produce the ordered garment according to an order, using information on size and a volume of order of the ordered garment, and provide calculated results to the modular process design unit.

24. The system of claim 18, wherein the garment pattern database unit is constructed by learning a reference garment pattern for each component of a garment based on a predetermined machine learning algorithm using general garment pattern data as learning data, and classifying learned reference garment patterns by garment and by pattern category to be stored in the garment pattern database.

25. The system of claim 18, wherein the modular process design unit determines the work modules based on one criterion or combined two or more criteria out of (i) sameness or similarity of the basic components for component-joining of the ordered garment, (ii) sameness of sewing machines to be used, and (iii) minimization of deviations between working times of the working modules.

26. The system of claim 18, wherein the modular process design unit designs configuration of the module processing lines based on at least one of (i) using sewing work priority of the determined work modules and component-joining order of the plurality of basic patterns as a basis of the design, and (ii) grouping the work modules such that works for work modules having similar shapes and joining orders and/or work modules that can worked jointly are performed in a same module processing line.

27. The system of claim 18, wherein the modular process design unit designs configuration of the module processing lines such that a deviation between working times taken to complete basic pattern products required for component-joining in the module processing lines is within ±5%.

* * * * *